(12) United States Patent (10) Patent No.: US 11,258,402 B2
Huang et al. (45) Date of Patent: Feb. 22, 2022

(54) DOUBLE GLASS MODULE

(71) Applicant: GREE ELECTRIC APPLIANCES, INC. OF ZHUHAI, Guangdong (CN)

(72) Inventors: Junzhe Huang, Guangdong (CN); Zhigang Zhao, Guangdong (CN); Hongming Liu, Guangdong (CN); Delin Yan, Guangdong (CN); Jiahui Lin, Guangdong (CN); Xiaolong Huang, Guangdong (CN); Wenbing Cao, Guangdong (CN)

(73) Assignee: GREE ELECTRIC APPLIANCES, INC. OF ZHUHAI, Guangdong (CN)

( * ) Notice: Subject to any disclaimer, the term of this patent is extended or adjusted under 35 U.S.C. 154(b) by 101 days.

(21) Appl. No.: 16/093,690

(22) PCT Filed: Mar. 30, 2017

(86) PCT No.: PCT/CN2017/078811
§ 371 (c)(1),
(2) Date: Oct. 15, 2018

(87) PCT Pub. No.: WO2017/177829
PCT Pub. Date: Oct. 19, 2017

(65) Prior Publication Data
US 2019/0140586 A1 May 9, 2019

(30) Foreign Application Priority Data
Apr. 14, 2016 (CN) .......................... 201610235385.9

(51) Int. Cl.
*H02S 40/22* (2014.01)
*H01L 31/054* (2014.01)
(Continued)

(52) U.S. Cl.
CPC ............ *H02S 40/22* (2014.12); *H01L 31/048* (2013.01); *H01L 31/0481* (2013.01);
(Continued)

(58) Field of Classification Search
CPC .......... H02S 40/22; H02S 40/42; H02S 40/34; H01L 31/052; H01L 31/048;
(Continued)

(56) References Cited

U.S. PATENT DOCUMENTS

2004/0067343 A1\* 4/2004 Beteille ............. B32B 17/10302
428/192
2007/0017567 A1 1/2007 Gronet et al.
(Continued)

FOREIGN PATENT DOCUMENTS

CN 201417779 \* 5/2009 ........... H01L 31/042
CN 101828269 A 9/2010
(Continued)

OTHER PUBLICATIONS

CN201417779, Machine Translation, Sun, May 2009 (Year: 2009).\*
(Continued)

*Primary Examiner* — Devina Pillay
(74) *Attorney, Agent, or Firm* — Armstrong Teasdale LLP

(57) ABSTRACT

A double glass module, including a front panel glass (10), a first adhesive film (20), a solar cell pack group (30), a second adhesive film (40), aluminum foil (50), a third adhesive film (60) and a rear panel glass (70) successively stacked. The aluminum foil is added in front of the rear panel glass of a double glass module, and since the aluminum foil has a high light reflectivity, the reflection effect for transmitted light energy is improved, so that the power of the double glass module is significantly enhanced. Meanwhile, since the aluminum foil has a better heat conductivity, the heat generated by the solar cell pack group can be conducted and dissipated in time, so that the temperature of the double glass module is reduced in time, thereby reducing a temperature coefficient impact factor, and prolonging a daily mean efficient power output time of the double glass module.

12 Claims, 1 Drawing Sheet

(51) Int. Cl.
*H01L 31/048* (2014.01)
*H01L 31/052* (2014.01)
*H02S 40/34* (2014.01)
*H02S 40/42* (2014.01)

(52) U.S. Cl.
CPC ........ *H01L 31/0488* (2013.01); *H01L 31/052* (2013.01); *H01L 31/054* (2014.12); *H02S 40/34* (2014.12); *H02S 40/42* (2014.12); *Y02E 10/52* (2013.01)

(58) Field of Classification Search
CPC ............... H01L 31/054; H01L 31/0488; H01L 31/0481; H01L 31/0547; Y02E 10/52; B32B 2307/732; B32B 15/20; B32B 15/082; B32B 3/02; B32B 7/12; B32B 15/08; B32B 17/10788; B32B 17/10036; B32B 2457/12
See application file for complete search history.

(56) References Cited

U.S. PATENT DOCUMENTS

| | | | |
|---|---|---|---|
| 2009/0159117 A1 | 6/2009 | Ferri et al. | |
| 2010/0206360 A1* | 8/2010 | Horioka | H01L 31/18 136/251 |
| 2012/0012163 A1* | 1/2012 | Yu | B32B 17/10036 136/251 |
| 2012/0103397 A1* | 5/2012 | Damm | B32B 17/10018 136/251 |
| 2013/0056047 A1* | 3/2013 | Beck | H02S 30/10 136/251 |
| 2013/0104982 A1* | 5/2013 | Gonzalez | H01L 31/02008 136/259 |

FOREIGN PATENT DOCUMENTS

| | | |
|---|---|---|
| CN | 102456774 A | 5/2012 |
| CN | 202434543 U | 9/2012 |
| CN | 203503670 U | 3/2014 |
| CN | 104465833 A | 3/2015 |
| CN | 204481037 U | 7/2015 |
| CN | 105489679 A | 4/2016 |
| CN | 205621750 U | 10/2016 |
| EP | 1351318 A2 | 10/2003 |
| EP | 2416374 A1 | 7/2009 |

OTHER PUBLICATIONS

International Search Report for International Patent Application No. PCT/CN2017/078811, dated Jun. 8, 2017, 2 pages.

Extended European Search Report for corresponding European Application No. 17781805.1, dated Nov. 21, 2019, 9 pages.

* cited by examiner

DOUBLE GLASS MODULE

CROSS-REFERENCE TO RELATED APPLICATIONS

The present application is the national stage entry of International Patent Application No. PCT/CN2017/078811, filed on Mar. 30, 2017, which claims the benefit of priority to Chinese Patent Application No. 201610235385.9, filed on Apr. 14, 2016, the contents of which are hereby incorporated by reference in their entirety.

TECHNICAL FIELD

The disclosure relates to the field of photovoltaic modules, and particularly relates to a double glass module.

BACKGROUND

As a double glass photovoltaic module has the characteristics of good weather resistance, long service life, good PID (Potential Induced Degradation) resistant performance and the like, it is particularly suitable for islands in moist and salt fog climate and parts combined with buildings.

The current double glass module generally includes a front panel glass, an EVA (ethylene-vinyl acetate copolymer) adhesive film, a solar cell pack group, an EVA adhesive film, and a rear panel glass successively stacked. A connecting box is further installed below the rear panel glass. A main ingredient of the EVA adhesive film is ethylene-vinyl acetate, and has the functions of adhesive connection, sealing, insulation and battery piece protection in the module. In addition, in order to improve a light transmittance of the front face of the double glass module, the EVA adhesive film adjacent to the front panel glass is generally a high-transmittance EVA adhesive film. At the same time, in order to improve an optical conversion efficiency of the double glass module, the EVA adhesive film adjacent to the rear panel glass is typically a high cut-off EVA adhesive film or a porcelain white EVA adhesive film.

However, because a backboard of the double glass module is glass, a light reflecting effect of the backboard is lacked relative to a single glass module, thus the power is reduced by 5-8 W compared with the single glass module in the same specification.

SUMMARY

The disclosure mainly aims to provide a double glass module, to solve a problem in the conventional art that the power of the double glass module is low.

In order to achieve the above purpose, according to one aspect of the disclosure, a double glass module is provided, the double glass module comprises a front panel glass, a first adhesive film, a solar cell pack group, a second adhesive film, aluminum foil, a third adhesive film and a rear panel glass successively stacked.

Further, the edge of the above second adhesive film is disposed around an edge of the aluminum foil.

Further, a distance between the edge of the above second adhesive film and the corresponding edge of the aluminum foil is 5-15 mm.

Further, an edge of the above third adhesive film is disposed around the edge of the aluminum foil.

Further, a distance between the edge of the above third adhesive film and the corresponding edge of the aluminum foil is 5-15 mm.

Further, the above first adhesive film is a high-transmittance EVA adhesive film.

Further, each of the above second adhesive film and third adhesive film is independently selected from any one of a high cut-off EVA adhesive film and a porcelain white EVA adhesive film.

Further, the above double glass module further comprises a connecting box installed on the surface, away from the third adhesive film, of the rear panel glass, the connecting box is electrically connected with the solar cell pack group and installed adjacent to the short side of the rear panel glass.

Further, the edge of the above first adhesive film is installed around the edge of the solar cell pack group, an annular area is formed among the first adhesive film, the second adhesive film and the solar cell pack group, the double glass module further includes an EVA blocking structure, and the EVA blocking structure is embedded in the annular area between the first adhesive film and the second adhesive film.

Further, the above EVA blocking structure comprises: an EVA adhesive block, wherein the EVA adhesive block is installed at a vertex angle of the annular area, the length and width size of the EVA adhesive block is 40-50*20-30 mm; a first EVA adhesive tape, wherein the first EVA adhesive tape is installed at a long edge area of the annular area, the width size of the first EVA adhesive tape is 30-40 mm, and the length of the first EVA adhesive tape is the same as the length of the long edge of the rear panel glass; a second EVA adhesive tape, wherein the second EVA adhesive tape is installed at a short edge area of the annular area, the length of the second EVA adhesive tape is the same as the length of the short edge of the rear panel glass, the width size of the second EVA adhesive tape positioned in the short edge area adjacent to the connecting box is 47-52 mm, and the width size of the second EVA adhesive tape positioned in the short edge area away from the connecting box is 20-30 mm.

In the technical scheme of the disclosure, the aluminum foil is added in front of the rear panel glass of the double glass module. Since the aluminum foil has a high light reflectivity, the reflection effect for transmitted light energy is improved, so that the power of the double glass module is significantly enhanced. At the same time, since the aluminum foil has a better heat conductivity, the heat generated by the solar cell pack group can be conducted and dissipated in time, so that the temperature of the double glass module can be reduced in time, thereby reducing a temperature coefficient impact factor, and prolonging a daily mean efficient power output time of the double glass module. In addition, the cost of the aluminum foil is lower, so that, compared with the scheme of adopting porcelain white EVA and high cut-off EVA to improve the reflection effect in the conventional art, the cost advantage thereof is particularly obvious.

BRIEF DESCRIPTION OF THE DRAWINGS

The drawings for constructing one part of the disclosure are used for providing the further understanding to the disclosure, schematic embodiments of the disclosure and descriptions thereof are used for explaining the disclosure, and do not intend to limit the disclosure inappropriately. In the drawings.

Figure 1:
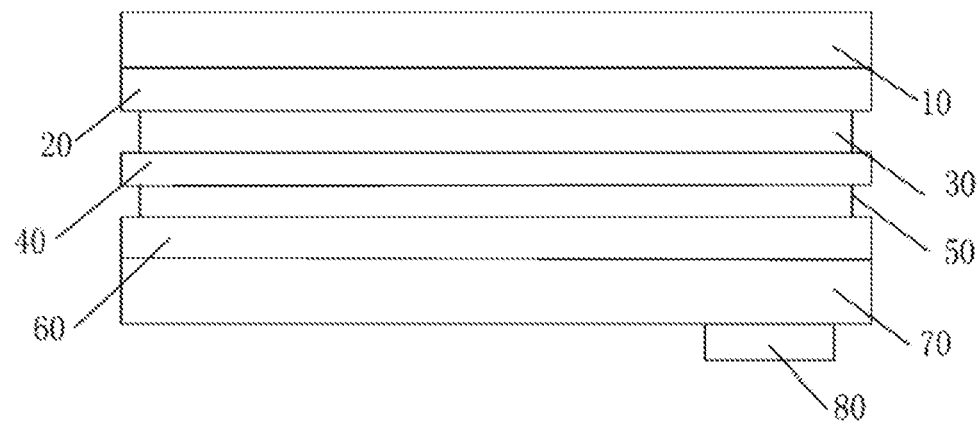
FIG. 1 shows a structure schematic diagram of the double glass module provided according to a typical implementation of the disclosure.

The above drawings include the following drawing marks:

10, front panel glass; 20, first adhesive film; 30, solar cell pack group; 40, second adhesive film; 50, aluminum foil; 60, third adhesive film; 70, rear panel glass; 80, connecting box; 90, EVA blocking structure; 91, EVA blocking block; 92, first EVA adhesive tape; and 93, second EVA adhesive tape.

DETAILED DESCRIPTION OF THE EMBODIMENTS

It is to be noted that the embodiments in the disclosure and the features in the embodiments may be mutually combined in the case without conflict. The disclosure is explained in detail with reference to the drawings in combination with the embodiments below.

As recorded in the background, a backboard of the double glass module in the conventional art is glass, a light reflecting effect of the backboard is lacked relative to a single glass module, the power is reduced by 5-8 W compared with the single glass module in the same specification. In order to solve this problem, the disclosure provides a double glass module, as shown in FIG. 1, the double glass module comprises a front panel glass 10, a first adhesive film 20, a solar cell pack group 30, a second adhesive film 40, aluminum foil 50, a third adhesive film 60 and a rear panel glass 70 successively stacked.

The aluminum foil 50 is added in front of the rear panel glass of a double glass module. Since the aluminum foil 50 has a high light reflectivity, the reflection effect for transmitted light energy is improved, so that the power of the double glass module is significantly enhanced. At the same time, since the aluminum foil 50 has a better heat conductivity, the heat generated by the solar cell pack group 30 can be conducted and dissipated in time, so that the temperature of the double glass module is reduced in time, thereby reducing a temperature coefficient impact factor, and prolonging a daily mean efficient power output time of the double glass module. In addition, the cost of the aluminum foil 50 is lower, so that, compared with the scheme of adopting porcelain white EVA and high cut-off EVA to improve the reflection effect in the conventional art, the cost advantage thereof is particularly obvious.

Through the experimental verification by applicant, the power of the double glass module containing 60 solar cell pieces may be improved by about 5 W through the technology, and the effect is more obvious.

In order to avoid an accidental short circuit problem caused by contact of the aluminum foil 50 and the solar cell pack group 30, as shown in FIG. 1, preferably, the edge of the second adhesive film 40 is disposed around the edge of the aluminum foil 50. At the same time, in order to guarantee the safety and the convenience of a laminating operation, as shown in FIG. 1, preferably, a distance between the edge of the above second adhesive film 40 and the corresponding edge of the aluminum foil 50 is 5-15 mm.

Further, in order to guarantee the stability of the aluminum foil 50 between the adhesive films, as shown in FIG. 1, preferably, the edge of the above third adhesive film 60 is disposed around the edge of the aluminum foil 50, and the aluminum foil 50 is covered by the second adhesive film 40 and the third adhesive film 60. In addition, in order to guarantee the safety and the convenience of the laminating operation similarly, as shown in FIG. 1, preferably, a distance between the edge of the above third adhesive film 60 and the corresponding edge of the aluminum foil 50 is 5-15 mm. The size of the above aluminum foil 50 is equal to the size of the solar cell pack group 30.

In order to further improve the power of the double glass module, preferably, the above first adhesive film 20 is a high-transmittance EVA adhesive film. A probability of light entering the solar cell pack group 30 is increased using the high-transmittance EVA adhesive film, and thereby the power of the double glass module is increased.

In the precondition of acceptable cost, in order to more optimize the power of the double glass module, preferably, each of the second adhesive film 40 and the third adhesive film 60 is independently selected from any one of a high cut-off EVA adhesive film and a porcelain white EVA adhesive film.

In a preferable embodiment of the disclosure, as shown in FIG. 1, the above double glass module further comprises a connecting box 80 installed on the surface, away from the third adhesive film 60, of the rear panel glass 70, the connecting box 80 is electrically connected with the solar cell pack group 30 and installed adjacent to the short edge of the rear panel glass 70. The electric energy generated by the double glass module of the disclosure is conveniently outwards transmitted by the connecting box 80.

Figure 2:
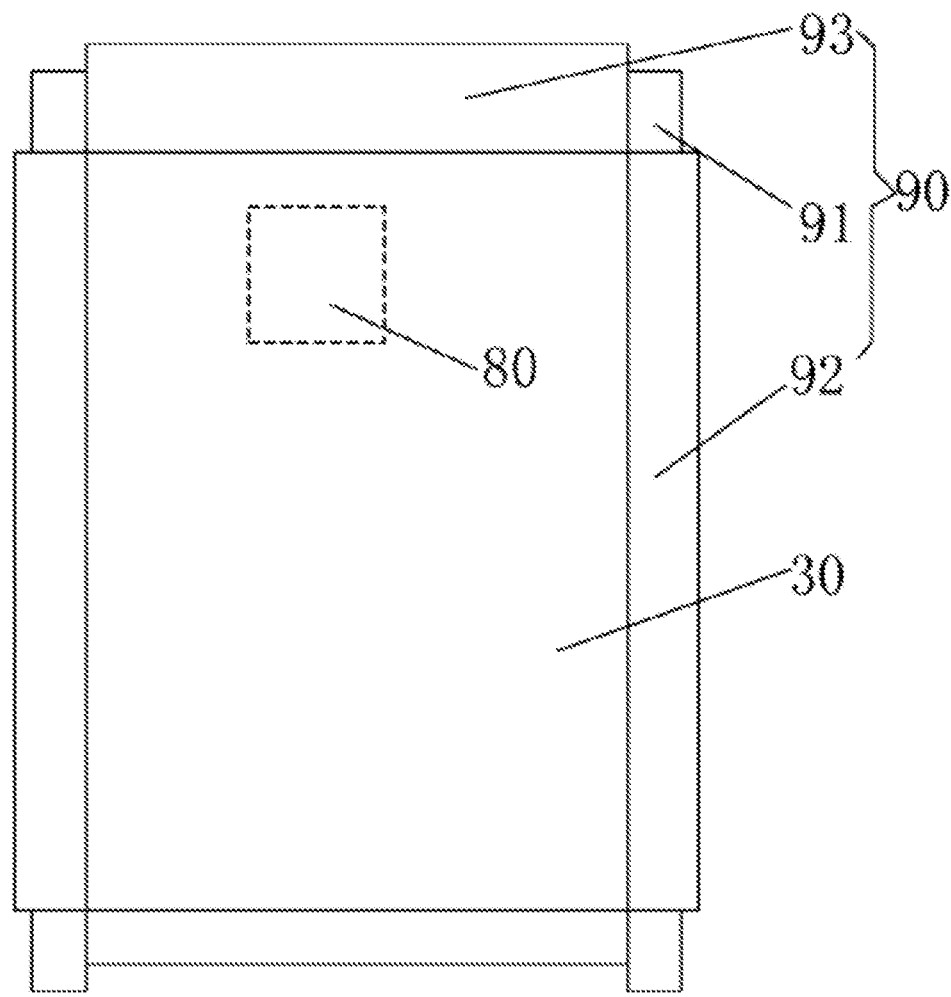
FIG. 2 shows a structure schematic diagram of an EVA blocking structure and a solar cell pack group, installed on a first adhesive film, of the double glass module provided by one preferable embodiment of the disclosure.

In a laminating process, because the hardness of the aluminum foil 50 is larger relative to the adhesive films, a bubble problem occurs easily, as shown in FIG. 2, preferably, the edge of the first adhesive film 20 is installed around the edge of the solar cell pack group 30, an annular area is formed among the first adhesive film 20, the second adhesive film 40 and the solar cell pack group 30. The double glass module further comprises an EVA blocking structure 90, and the EVA blocking structure 90 is embedded in the annular area between the first adhesive film 20 and the second adhesive film 40. Through embedding the EVA blocking structure 90 in the annular area between the first adhesive film 20 and the second adhesive film 40, an empty space formed after the deformation of the aluminum foil 50 and the glass is filled up by the EVA blocking structure 90 in the laminating process, thereby the generation of the bubbles is reduced.

In another preferable embodiment, as shown in FIG. 2, the above EVA blocking structure 90 comprises an EVA adhesive block 91, a first EVA adhesive tape 92 and a second EVA adhesive tape 93. The EVA adhesive block 91 is installed at a vertex angle of an annular area, the length and width size of the EVA adhesive block 91 is 40-50*20-30 mm, preferably 45*25 mm; the first EVA adhesive tape 92 is installed at a long edge area of the annular area, the width size of the first EVA adhesive tape 92 is 30-40 mm, preferably 35 mm, the length of the first EVA adhesive tape 92 is equal to the length of the long edge of the rear panel glass 70; the second EVA adhesive tape 93 is installed in a short edge area of the annular area, wherein the length of the second EVA adhesive tape 93 is equal to the length of the short edge of the rear panel glass, the width size of the second EVA adhesive tape 93 installed in the short edge area adjacent to the connecting box 80 is 47-52 mm, preferably 49 mm, the width size of the second EVA adhesive tape 93 installed in the short edge area away from the connecting box 80 is 20-30 mm, preferably 25 mm. In allusion to the stress in the different positions in the laminating process and the different deformations, the EVA in the different shapes and sizes is installed, and thereby the generation of the bubbles is more obviously reduced. Because four corners of the module are seriously deformed in the laminating process, the stress in the four corners after laminating is maximum, and more melted EVA adhesive film is extruded, the size of the EVA adhesive block at the vertex angle is larger slightly and the EVA adhesive block may be filled with the extruded melting EVA. In addition, the edge of the EVA is stretched into the lower part of the solar cell pack group after melted, achieving an effect of gradient-relieving the stress, and preventing the bubbles from back-flowing and injecting into the module.

In order to implement the disclosure by those skilled in the art, a setting and laminating method of the double glass module of the disclosure is described below.

Tempered glass is lifted onto a laminating workbench, the glass fabric surface is upwards installed, the tempered glass is detected whether to have a defect, and used as the front panel glass;

The first adhesive film is laid on the front panel glass and the fabric surface is guaranteed to be upwards installed, and the smoothness and the edge alignment of the first adhesive film are guaranteed carefully. The solar cell pieces are laid and arranged on the first adhesive film, and positive and negative electrode positions are carefully installed and detected whether to have phenomena, such as subfissure and cold solder joint. A spacing distance of each battery string is 4.2±0.5 mm, and the string spacing has no obvious deviation, an edge distance between two strings at the outer end and the short edge of the front panel glass is 14±1 mm, and the edge distance has no obvious deviation. An adhesive tape is laid on a template so that the template is guaranteed to be aligned to the edge of the front panel glass, an excess material is lightly cut after a bus bar is welded according to the template, an outlet hole is laid with an insulating backboard of which the size is 90 mm*295 mm, and upwards and downwards laid with an EVA film of which the size is 100 mm*305 mm, and the solar cell pack group is formed;

The second adhesive film is laid on the solar cell pack group, the outlet end of the bus bar is punched; three layers of the EVA adhesive blocks, of which the EVA length and width size is 45 mm*25 mm, are installed under the vertex angle of the first adhesive film; the long edge area of the first adhesive film is provided with the first EVA adhesive tape, of which the width size is 35 mm, in the short edge area of the first adhesive film; the width size of the second EVA adhesive tape at the short edge adjacent to the connecting box is 49 mm, and the width size of the second EVA adhesive tape at the short edge away from the connecting box is 25 mm, the size deviation is controlled to be less than or equal to ±2 mm, and the length of the above adhesive tape is equal to the edge length of the corresponding solar cell piece.

Prepared aluminum foil paper is cut, and laid on the second adhesive film. The aluminum foil is carefully guaranteed to be smooth without the obvious fold, and a short circuit problem caused by direct contact between the aluminum foil paper and the bus bar is prevented;

The third adhesive film is laid on the smoothly laid aluminum foil paper so that the part between the second adhesive film and the third adhesive film is covered by the aluminum foil paper, the adhesive film is guaranteed to be even and straight better and the size is 10 mm higher than the edge of the aluminum foil paper;

The third adhesive film is covered by backboard glass so that the battery piece is prevented from fracturing, the bus bar is guaranteed to be aligned to a position of a connecting port, the upper and lower glass is aligned by using jaws of death in both hands, and the battery piece excursion is carefully prevented in a process.

An E-L test is performed on the module before laminating, checking whether to have subfissure, fragments, cold solder joint and the like, the module laminating is performed after guaranteeing that a quality defect is not existent. A laminating parameter is set and the module is placed in a laminating machine for laminating, and guaranteeing that the laminated module has no phenomena, such as bubbles, fragments and bus bar displacement. After laminating, the E-L test is performed to guarantee that the module has no obvious defect, and a margin of the corner EVA is cut by an edge-cutting tool so that the edge of the module is guaranteed to be aligned and beautiful. A laminated aluminum foil light-reflecting module is placed on an L-V tester, and a module power test is performed.

The beneficial effect of the disclosure is further explained in combination with the embodiments and comparison examples below.

Using the solar cell pack group containing 6 solar cell pieces as an example, the first EVA adhesive film is a Swick high-transmittance EVA, each of the second EVA adhesive film and the third EVA adhesive film is a Swick high cut-off EVA.

Comparison Example 1

The double glass module comprises a front panel glass, a first EVA adhesive film, a solar cell pack group, a second EVA adhesive film, and a rear panel glass successively stacked.

Embodiment 1

Aluminum foil and a third EVA adhesive film are added between the second EVA adhesive film and the rear panel glass of the double glass module in the comparison example 1. The length and width size of an EVA adhesive block is 45*25 mm; the length and width size of a first EVA adhesive tape is 35*25 mm; and the length and width size of a second EVA adhesive tape is 49*25 mm.

Using solar standard test conditions: a spectrum is AM 1.5, an irradiancy is 1000 W/m2, an module temperature is 25 DEG C, and a testing device is a Pegatron solar module I-V tester, testing Voc, Isc, Vm, Im and Pm, and a testing result is as shown in Table 1.

TABLE 1

|  | Comparison example 1 | Embodiment 1 |
| --- | --- | --- |
| Voc (V) | 3.30 | 3.33 |
| Isc (A) | 8.60 | 8.72 |
| Vm (V) | 2.63 | 2.65 |
| Im (A) | 7.97 | 8.09 |
| PM (W) | 20.95 | 21.40 |

It is observed from the above data comparison that the module power in the embodiment 1, which is added with light-reflecting aluminum foil, is improved by 2.4% relative to the module power in the comparison example 1. Converted to 250 W of the module, the module power is improved by 6 W equivalently. Assuming that a selling price of a photovoltaic module is 4 Yuan/W, the profit of the photovoltaic module may be improved by 24 Yuan through adding the light-reflecting aluminum foil.

Embodiment 2

A laminating structure of the double glass module is the same as the embodiment 1, an EVA blocking structure is additionally installed, the length and width size of an EVA adhesive block is 45*25 mm; the width size of a first EVA adhesive tape is 35 mm; the width size of a second EVA adhesive tape installed in the short edge area adjacent to a connecting box is 49 mm, the width size of the second EVA adhesive tape installed in the short edge area away from the connecting box is 25 mm, and the length of the above adhesive tapes is equal to the edge length of the corresponding solar cell piece.

Embodiment 3

A laminating structure of the double glass module is the same as the embodiment 1, an EVA blocking structure is additionally installed, the length and width size of an EVA adhesive block is 40*30 mm; the width size of a first EVA adhesive tape is 30 mm; the width size of a second EVA adhesive tape installed in the short edge area adjacent to a connecting box is 52 mm, the width size of the second EVA adhesive tape installed in the short edge area away from the connecting box is 20 mm, and the length of the above adhesive tapes is equal to the edge length of the corresponding solar cell piece.

Embodiment 4

A laminating structure of the double glass module is the same as the embodiment 1, an EVA blocking structure is additionally installed, the length and width size of an EVA adhesive block is 30*20 mm; the width size of a first EVA adhesive tape is 40*20 mm; the width size of a second EVA adhesive tape installed in the short edge area adjacent to a connecting box is 47 mm, the width size of the second EVA adhesive tape installed in the short edge area away from the connecting box is 30 mm, and the length of the above adhesive tapes is equal to the edge length of the corresponding solar cell piece.

It is observed that bubbles in the embodiments 2 to 4 are apparently less than that in the embodiment 1, and the embodiment 2 has not any bubbles almost.

It is observed from the above description that the above embodiments of the disclosure achieve the following technical effects:

The aluminum foil is added in front of the rear panel glass of a double glass module, and since the aluminum foil has a high light reflectivity, the reflection effect for transmitted light energy is improved, so that the power of the double glass module is significantly enhanced. At the same time, since the aluminum foil has a better heat conductivity, the heat generated by the solar cell pack group can be conducted and dissipated in time, so that the temperature of the double glass module is reduced in time, thereby reducing a temperature coefficient impact factor, and prolonging a daily mean efficient power output time of the double glass module. In addition, the cost of the aluminum foil is lower, so that, compared with the scheme of adopting porcelain white EVA and high cut-off EVA to improve the reflection effect in the conventional art, the cost advantage thereof is particularly obvious.

The above are merely the optional embodiments of the disclosure and not intended to limit the scope of protection of the disclosure. For those skilled in the art, the disclosure may have various modifications and variations. Any modifications, equivalent replacements, improvements and the like made within the spirit and principle of the disclosure shall fall within the scope of protection of the disclosure.

What is claimed is:

1. A double glass module, wherein the double glass module comprises a front panel glass, a first adhesive film, a solar cell pack group, a second adhesive film, aluminum foil, a third adhesive film and a rear panel glass successively stacked, the edge of the first adhesive film is installed around the edge of the solar cell pack group, an annular area is formed among the first adhesive film, the second adhesive film and the solar cell pack group, the double glass module further comprises an ethylene-vinyl acetate copolymer (EVA) blocking structure, and the EVA blocking structure is embedded in the annular area between the first adhesive film and the second adhesive film, the EVA blocking structure consists of EVA, and an empty space formed after the deformation of the aluminum foil and the glass is filled up by the EVA blocking structure in the laminating process, the EVA blocking structure consists of:

an EVA adhesive block, wherein the EVA adhesive block is installed at a vertex angle of the annular area, the length and width size of the EVA adhesive block is 40-50 mm by 20-30 mm;

first EVA adhesive tapes, wherein the first EVA adhesive tapes are installed at long edge area of the annular areas, the width size of the first EVA adhesive tapes are 30-40 mm, and the length of the first EVA adhesive tapes are the same as the length of the long edge of the rear panel glass; and second EVA adhesive tapes, wherein the second EVA adhesive tapes are installed at short edge area of the annular areas, the length of the second EVA adhesive tapes are the same as the length of the short edge of the rear panel glass, the width size of the second EVA adhesive tape positioned in the short edge area adjacent to the connecting box is 47-52 mm, and the width size of the second EVA adhesive tape positioned in the short edge area away from the connecting box is 20-30 mm.

2. The double glass module as claimed in claim 1, wherein the first adhesive film is a high-transmittance EVA adhesive film.

3. The double glass module as claimed in claim 1, wherein each of the second adhesive film and the third adhesive film is independently selected from any one of a high cut-off EVA adhesive film and a porcelain white EVA adhesive film.

4. The double glass module as claimed in claim 1, wherein the double glass module further comprises a connecting box installed on the surface, away from the third adhesive film, of the rear panel glass, the connecting box is electrically connected with the solar cell pack group and installed adjacent to the short edge of the rear panel glass.

5. The double glass module as claimed in claim 1, wherein an edge of the third adhesive film is disposed around the edge of the aluminum foil.

6. The double glass module as claimed in claim 5, wherein a distance between the edge of the third adhesive film and the corresponding edge of the aluminum foil is 5-15 mm.

7. The double glass module as claimed in claim 1, wherein an edge of the second adhesive film is disposed around an edge of the aluminum foil.

8. The double glass module as claimed in claim 7, wherein an edge of the third adhesive film is disposed around an edge of the aluminum foil.

9. The double glass module as claimed in claim 8, wherein a distance between the edge of the third adhesive film and the corresponding edge of the aluminum foil is 5-15 mm.

10. The double glass module as claimed in claim 1, wherein a distance between the edge of the second adhesive film and the corresponding edge of the aluminum foil is 5-15 mm.

11. The double glass module as claimed in claim 10, wherein an edge of the third adhesive film is disposed around the edge of the aluminum foil.

12. The double glass module as claimed in claim 11, wherein a distance between the edge of the third adhesive film and the corresponding edge of the aluminum foil is 5-15 mm.

* * * * *

UNITED STATES PATENT AND TRADEMARK OFFICE
CERTIFICATE OF CORRECTION

| | |
|---|---|
| PATENT NO. | : 11,258,402 B2 |
| APPLICATION NO. | : 16/093690 |
| DATED | : February 22, 2022 |
| INVENTOR(S) | : Huang et al. |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 171 days.

Signed and Sealed this
Twenty-fifth Day of February, 2025

Coke Morgan Stewart
*Acting Director of the United States Patent and Trademark Office*